(12) United States Patent
Honjo (10) Patent No.: US 8,227,699 B2
(45) Date of Patent: Jul. 24, 2012

(54) PRINTED CIRCUIT BOARD

(75) Inventor: Mitsuru Honjo, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 1031 days.

(21) Appl. No.: 12/019,661

(22) Filed: Jan. 25, 2008

(65) Prior Publication Data

US 2008/0283286 A1    Nov. 20, 2008

(30) Foreign Application Priority Data

Jan. 26, 2007   (JP) ................. 2007-016883

(51) Int. Cl.
   *H05K 1/03*   (2006.01)
(52) U.S. Cl. ....................... 174/255; 174/262
(58) Field of Classification Search ................. 174/255, 174/260–262
   See application file for complete search history.

(56) References Cited

U.S. PATENT DOCUMENTS

| | | | |
|---|---|---|---|
| 5,525,953 A | | 6/1996 | Okada et al. |
| 5,692,669 A | * | 12/1997 | Sakemi et al. ........... 228/180.21 |
| 6,994,563 B2 | * | 2/2006 | Amini et al. .................... 439/62 |
| 2003/0112617 A1 | | 6/2003 | Ueno et al. |
| 2003/0188889 A1 | | 10/2003 | Straub et al. |
| 2005/0136699 A1 | | 6/2005 | Amini et al. |
| 2006/0129061 A1 | | 6/2006 | Kaneto et al. |
| 2006/0164179 A1 | | 7/2006 | Arai et al. |
| 2006/0290742 A1 | | 12/2006 | Imai |

FOREIGN PATENT DOCUMENTS

| | | |
|---|---|---|
| EP | 0384644 A1 | 8/1990 |
| EP | 1 671 669 A1 | 6/2006 |
| JP | 05-235495 A | 9/1993 |
| JP | 06-309950 A | 11/1994 |
| JP | 2000-137239 A | 5/2000 |
| JP | 02003347699 A * | 12/2003 |
| JP | 2004-254257 A | 9/2004 |
| JP | 2006140221 A | 6/2006 |
| WO | 2006121194 A1 | 11/2006 |

OTHER PUBLICATIONS

Second Office Action Issued Jan. 12, 2011 in CN Application No. 200810003560.7 (Partial English Translation Only).
Office Action Issued Jul. 27, 2010 in Chinese Appln. Ser. No. 200810003560.7 (with partial English Translation).
Notice of Reasons for Refusal dated Aug. 30, 2011 in JP Application No. 2007-016883; English Translation.
Office Action Issued Dec. 1, 2011 in Chinese Appln. Ser. No. 200810003560.7. (with partial English Translation).

* cited by examiner

*Primary Examiner* — Ishwarbhai Patel
(74) *Attorney, Agent, or Firm* — Panitch Schwarze Belisario & Nadel LLP (57) ABSTRACT

A printed circuit board includes a base insulating layer, first to third signal lines, a first cover insulating layer and a conductive layer. Wide parts are formed in the first to third signal lines. The first cover insulating layer is provided on the base insulating layer so as to cover the wide parts. The conductive layer is provided on the first cover insulating layer so as to cover a portion above the wide parts.

6 Claims, 9 Drawing Sheets

PRINTED CIRCUIT BOARD

BACKGROUND OF THE INVENTION

1. Field of the Invention

The present invention relates to a printed circuit board used for various types of electric equipment and electronic equipment.

2. Description of the Background Art

In recent years, electric equipment, electronic equipment and the like (hereinafter abbreviated as electronic equipment and the like) have progressed in digitization while being sophisticated. With the digitization and sophistication, frequencies of digital signals handled in the electronic equipment and the like have become higher.

When the digital signal is handled in the electronic equipment and the like, high frequency noise is likely to be produced due to the harmonic. Thus, the electronic equipment and the like malfunction in some cases. Therefore, a printed circuit board including a low-pass filter has been developed to prevent generation of the high-frequency noise (see JP 2004-254257 A, for example).

In the printed circuit board with the built-in low-pass filter described in JP 2004-254257 A, the low-pass filter is composed of a stripline, a ground capacitor electrode and a ground electrode. This low-pass filter attenuates the harmonic.

In the above-described printed circuit board with the built-in low-pass filter, however, the stripline, the ground capacitor electrode and the ground electrode are formed in different layers. That is, in the configuration of JP 2004-254257 A, it is necessary to provide a number of layers on which the stripline, the ground capacitor electrode and the ground electrode are formed, thereby making it difficult to reduce the printed circuit board in thickness.

SUMMARY OF THE INVENTION

It is an object of the present invention to provide a thin printed circuit board capable of preventing generation of high frequency noise.

(1) According to an aspect of the present invention, a printed circuit board includes a base insulating layer, a signal line that is provided on the base insulating layer and includes a wide part, a cover insulating layer that is provided on the base insulating layer so as to cover at least the wide part of the signal line and a conductive layer that is provided on the cover insulating layer.

In this printed circuit board, a capacitive element is formed of the wide part, the cover insulating layer and the conductive layer. A harmonic of a signal transmitted by the signal line is removed by the above-mentioned capacitive element. Thus, according to this printed circuit board, generation of high frequency noise at the time of the signal transmission can be prevented.

In addition, the wide part that constitutes the capacitive element is formed in the signal line in this printed circuit board. That is, the signal line is part of constituent elements of the capacitive element. This allows the capacitive element to be formed without providing a number of layers. As a result, the printed circuit board can be reduced in thickness.

(2) The printed circuit board may further include a ground line that is provided on the base insulating layer, and the conductive layer may be electrically connected to the ground line.

In this case, since the conductive layer is electrically connected to the ground line, the harmonic of the signal transmitted by the signal line can be reliably removed. In addition, since the signal line and the conductive layer are formed on the common layer (base insulating layer), the printed circuit board can be reduced in thickness.

(3) The cover insulating layer may be formed so as to cover the ground line and the signal line, and the cover insulating layer may include a through hole for electrically connecting the ground line and the conductive layer.

In this case, since the ground line and the signal line are connected to each other via the through hole, the ground line and the signal line can be easily connected to each other. This allows the printed circuit board to be easily manufactured.

(4) The wide part may be provided on an end of the signal line.

In this case, the harmonic of the signal input from electronic equipment and the like to the printed circuit board can be reliably removed. Also, the harmonic of the signal output from the printed circuit board to the electronic equipment and the like can be reliably removed. These results allow the generation of the high frequency noise to be reliably prevented.

(5) The signal line may include a plurality of the wide parts. In this case, the harmonic of the signal transmitted by the signal line can be more reliably removed. This allows the generation of the high frequency noise to be more reliably prevented.

(6) A plurality of the signal lines may be formed on the base insulating layer, and the wide parts of the plurality of signal lines may be arranged in a staggered manner.

In this case, the plurality of wide parts can be formed while an increase in the length of the printed circuit board in a width direction is prevented. This allows the printed circuit board to be reduced in size.

According to the present invention, the capacitive element is formed of the wide part, the cover insulating layer and the conductive layer. The harmonic of the signal transmitted by the signal line is removed by the above-mentioned capacitive element. Thus, the generation of the high frequency noise at the time of the signal transmission can be prevented.

Moreover, the wide part that constitutes the capacitive element is formed in the signal line. That is, the signal line is the part of the constituent elements of the capacitive element. This allows the capacitive element to be formed without providing a number of layers. As a result, the printed circuit board can be reduced in thickness.

Other features, elements, characteristics, and advantages of the present invention will become more apparent from the following description of preferred embodiments of the present invention with reference to the attached drawings.

DESCRIPTION OF THE PREFERRED EMBODIMENTS

A printed circuit board according to an embodiment of the present invention will now be described with reference to drawings.

(1) Method of Manufacturing Printed Circuit Board

FIGS. 1(a) and 1(b) to 5(a) and 5(b) are schematic views showing an example of steps in a method of manufacturing the printed circuit board according to the embodiment of the present invention. Note that each of FIGS. 1(a), 2(a), 3(a), 4(a) and 5(a) is a top view, and each of FIGS. 1(b), 2(b), 3(b), 4(b) and 5(b) is a sectional view taken along the line A-A of FIGS. 1(a), 2(a), 3(a), 4(a) and 5(a).

As shown in FIGS. 1(a) and 1(b), a ground line 2, a first signal line 3a, a second signal line 3b and a third signal line 3c are formed on an upper surface of a long-sized base insulating layer 1 consisting of, for example, polyimide resin so as to extend in the longitudinal direction of the base insulating layer 1. The ground line 2 and the first to third signal lines 3a to 3c are formed by a known semi-additive method or a known subtractive method, for example. Each of the ground line 2 and the first to third signal lines 3a to 3c consists of, for example, copper.

Figure 1:
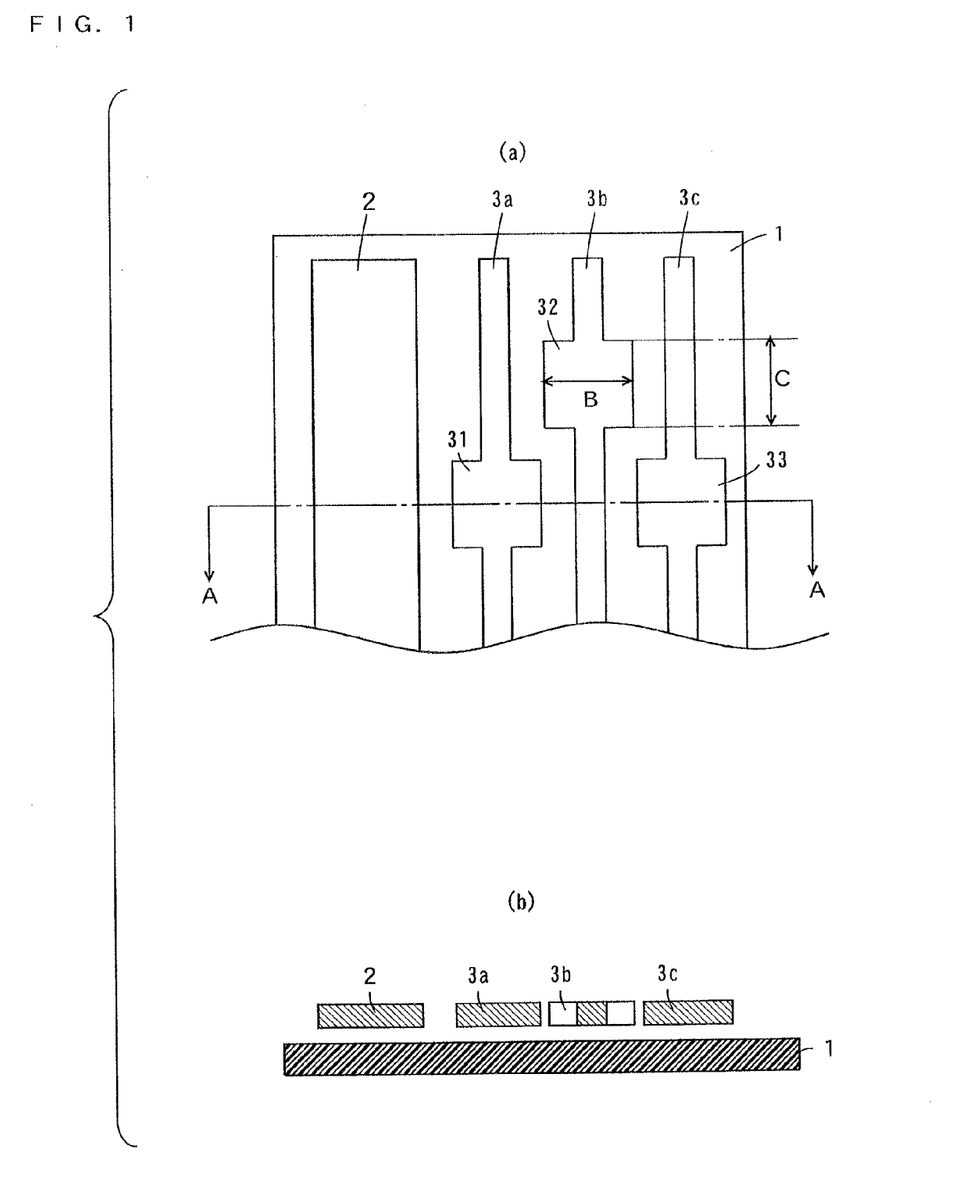
FIGS. 1(a), 2(a), 3(a), 4(a) and 5(a) are schematic plan views showing an example of steps in a method of manufacturing a printed circuit board according to an embodiment of the present invention.
FIGS. 1(b), 2(b), 3(b), 4(b) and 5(b) are schematic sectional views showing an example of steps in a method of manufacturing a printed circuit board according to an embodiment of the present invention.
Figure 2:
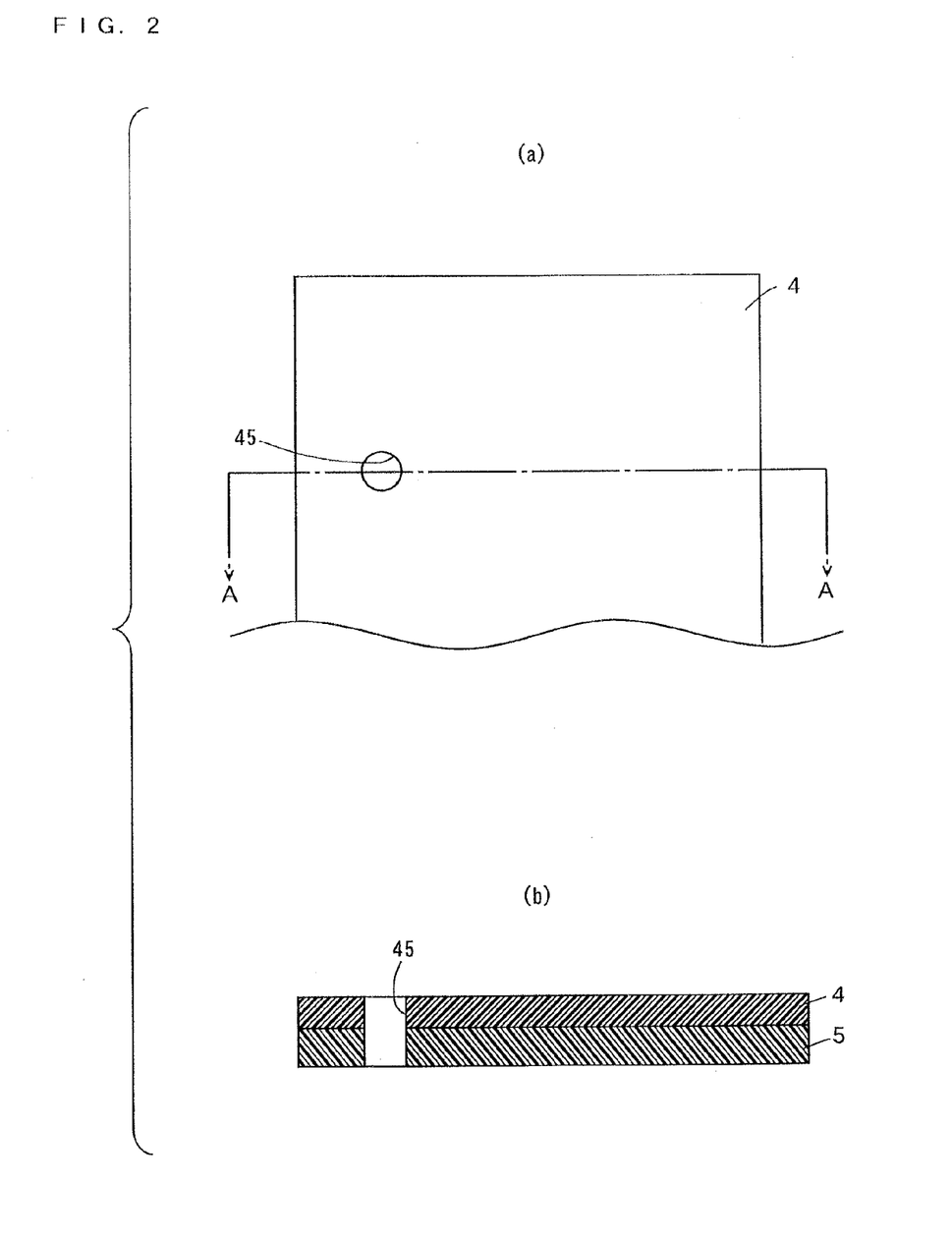
Figure 3:
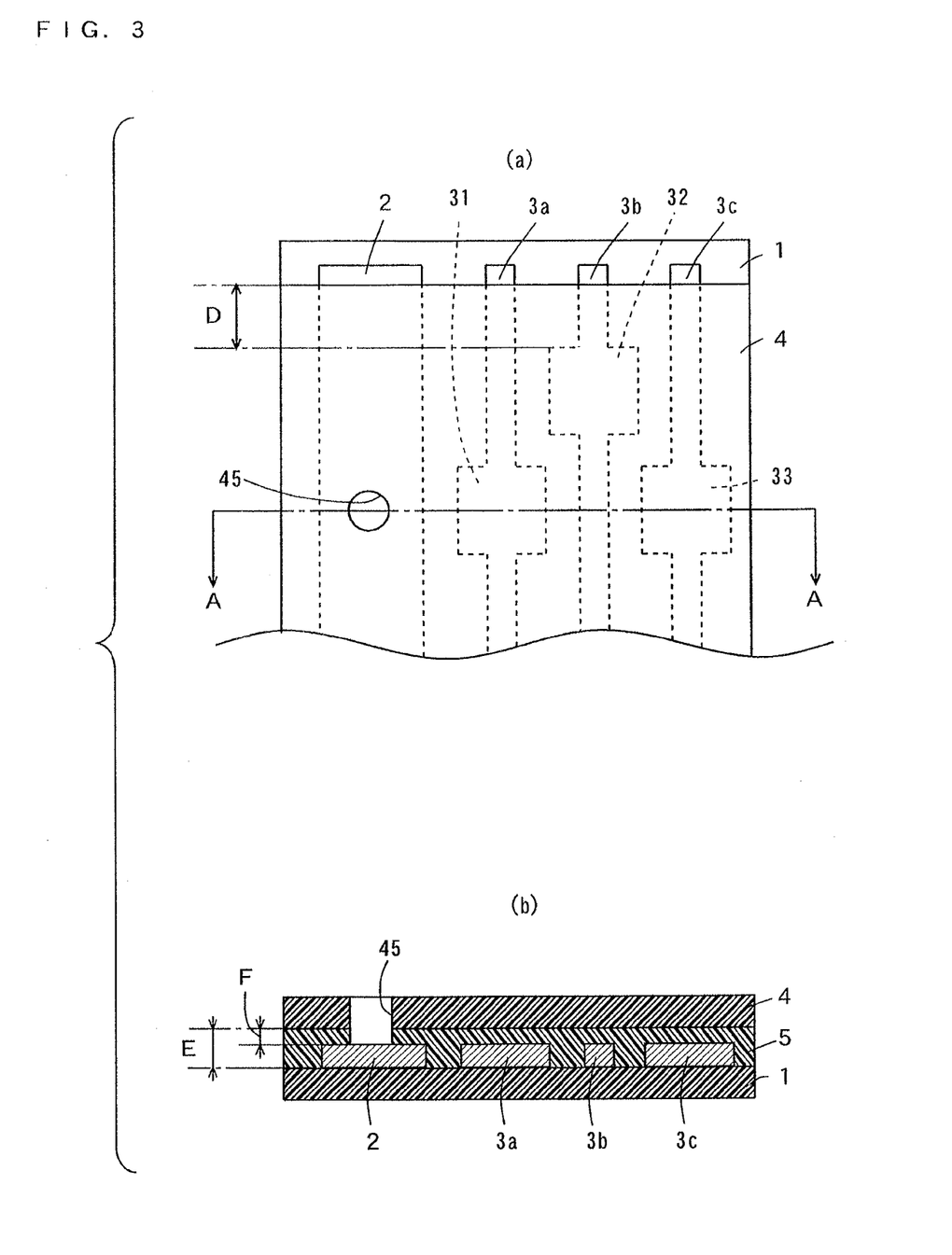
Figure 4:
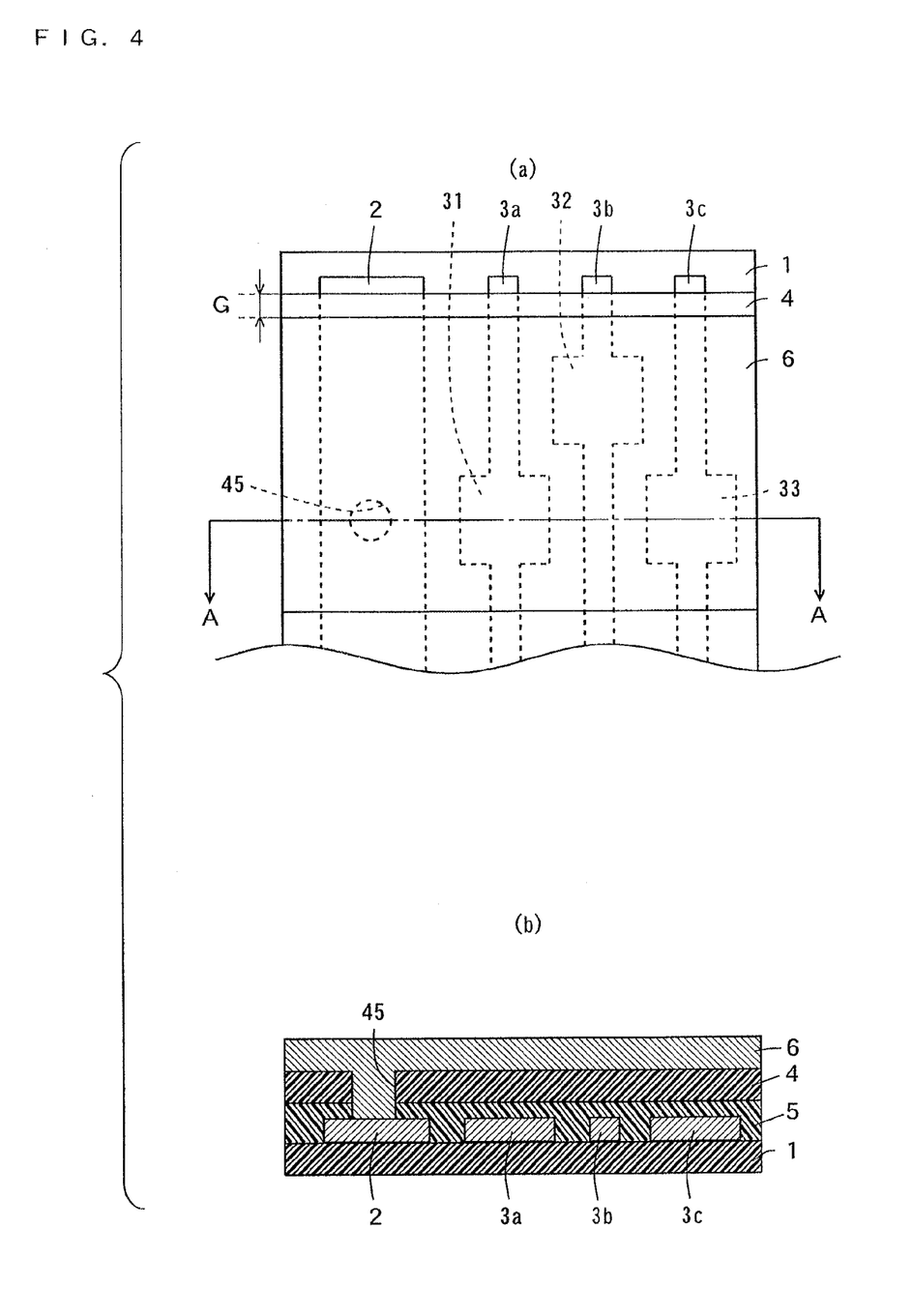

As shown in FIG. 1 (a), rectangular wide parts 31 to 33 are formed in a staggered arrangement in the first to third signal lines 3a to 3c. A width B of each of the wide parts 31 to 33 is preferably 0.1 mm to 5 mm, and a length C is preferably 1 mm to 5 mm. Note that respective one ends of the base insulating layer 1, the ground line 2 and the first to third signal lines 3a to 3c are shown in FIG. 1 (a). The thickness of each of the ground line 2 and the first to third signal lines 3a to 3c is preferably 5 μm to 30 μm, and more preferably 8 μm to 25 μm.

Next, as shown in FIGS. 2(a) and 2(b), a long-sized first cover insulating layer 4 is prepared, and an adhesive layer 5 is formed on the lower surface of the first cover insulating layer 4. In addition, a through hole 45 that penetrates the first cover insulating layer 4 and the adhesive layer 5 is formed.

The first cover insulating layer 4 and a second cover insulating layer 7, described later, consist of, for example, polyimide resin and the adhesive layer 5 consists of, for example, epoxy resin, acrylic resin, butyral resin or the like. The thickness of the first cover insulating layer 4 is preferably 10 μm to 50 μm, and more preferably 12 μm to 30 μm. The diameter of the through hole 45 is preferably 1 mm to 10 mm, and more preferably 2 mm to 5 mm.

Then, as shown in FIGS. 3(a) and 3(b), the first cover insulating layer 4 is bonded to the upper surface of the base insulating layer 1 by the adhesive layer 5 so that the respective one ends of the ground line 2 and the first to third signal lines 3a to 3c are exposed. Note that the through hole 45 is formed so as to be arranged above the ground line 2.

A distance D between one end of the first cover insulating layer 4 and the wide part 32 that is the closest to the one end of the first cover insulating layer 4 is preferably 0.5 mm to 5 mm. It is preferable that a thickness E of the adhesive layer 5 is set so that a distance F between the upper surface of the ground line 2 and the lower surface of the first cover insulating layer 4 and between the respective upper surfaces of the first to third signal lines 3a to 3c and the lower surface of the first cover insulating layer 4 is 1 μm to 20 μm, and is more preferable that the thickness E is set so that the distance F is 3 μm to 10 μm.

Next, as shown in FIGS. 4(a) and 4(b), a conductive layer 6 is formed on the first cover insulating layer 4 so as to cover a portion above the wide parts 31 to 33. Note that the conductive layer 6 consists of, for example, conductive paste such as silver paste or copper paste. The through hole 45 is filled with this conductive paste. Accordingly, the ground line 2 and the conductive layer 6 are electrically connected to each other.

The thickness of the conductive layer 6 is preferably 10 μm to 50 μm, and more preferably 15 μm to 30 μm. Moreover, a distance G between the one end of the first cover insulating layer 4 and one end of the conductive layer 6 is preferably 0.5 mm to 5 mm.

Finally, the second cover insulating layer 7 is formed on the first cover insulating layer 4 so as to cover the conductive layer 6 as shown in FIGS. 5(a) and 5(b). Thus, the printed circuit board 100 is completed. Note that the first to third signal lines 3a to 3c transmit a high frequency digital signal, for example.

(2) Effects of the Printed Circuit Board

In the printed circuit board 100 (FIGS. 5(a) and 5(b)) according to the present embodiment, the conductive layer 6 is formed on the first cover insulating layer 4 so as to cover the portion above the wide parts 31 to 33. In addition, the conductive layer 6 is electrically connected to the ground line 2. In this case, a capacitive element is formed of the wide parts 31 to 33, the adhesive layer 5, the first cover insulating layer 4 and the conductive layer 6. This capacitive element can remove a harmonic of the digital signal transmitted by the first to third signal lines 3a to 3c. This can prevent generation of high frequency noise. As a result, malfunction of the electronic equipment and the like can be prevented.

Moreover, the wide parts 31 to 33 that constitute the capacitive element are formed in the first to third signal lines 3a to 3c in the present embodiment. This obviates the need to form the wide parts 31 to 33 for forming the capacitive element separately from the first to third signal lines 3a to 3c. Accordingly, the printed circuit board 100 can be reduced in thickness and size.

Furthermore, the wide parts 31 to 33 are formed in the staggered arrangement. This can reduce the printed circuit board 100 in size in the width direction.

In addition, the ground line 2 and the first to third signal lines 3a to 3c are formed on the common base insulating layer 1. This obviates the need to separately provide layers on which the ground line 2 and the first to third signal lines 3a to 3c are formed. Accordingly, the printed circuit board 100 can be further reduced in thickness.

Moreover, the wide parts 31 to 33 are formed on the respective one ends of the first to third signal lines 3a to 3c. That is, the wide parts 31 to 33 are arranged in the vicinity of a connector for inputting/outputting the digital signal. In this case, the harmonic of the digital signal input from the electronic equipment and the like to the printed circuit board 100 can be reliably removed. Also, the harmonic of the digital signal output from the printed circuit board 100 to the electronic equipment and the like can be reliably removed. These results can reliably prevent the generation of the high frequency noise. Accordingly, the malfunction of the electronic equipment and the like can be reliably prevented.

While the three wide parts 31 to 33 are shown in the above description, two or more wide parts may be formed in each of the first to third signal lines 3a to 3c.

Furthermore, while the rectangular wide parts 31 to 33 are formed in the first to third signal lines 3a to 3c in the above description, wide parts with other shapes such as a circular shape or a triangular shape may be formed.

(3) Other Embodiments

A material for the base insulating layer 1, the first cover insulating layer 4 and the second cover insulating layer 7 is not limited to polyimide resin, and other insulating material such as polyethylene terephthalate, polyethernitrile, polyethersulphone may be used.

In addition, a material for the ground line 2 and the first to third signal lines 3a to 3c is not limited to copper, and other metallic material such as copper alloy, gold, aluminum may be used.

While the ground line 2 and the first to third signal lines 3a to 3c are formed on the upper surface of the base insulating layer 1 in the above-described embodiment, the ground lines and the signal lines may be formed on both sides of the base insulating layer 1.

Figure 5:
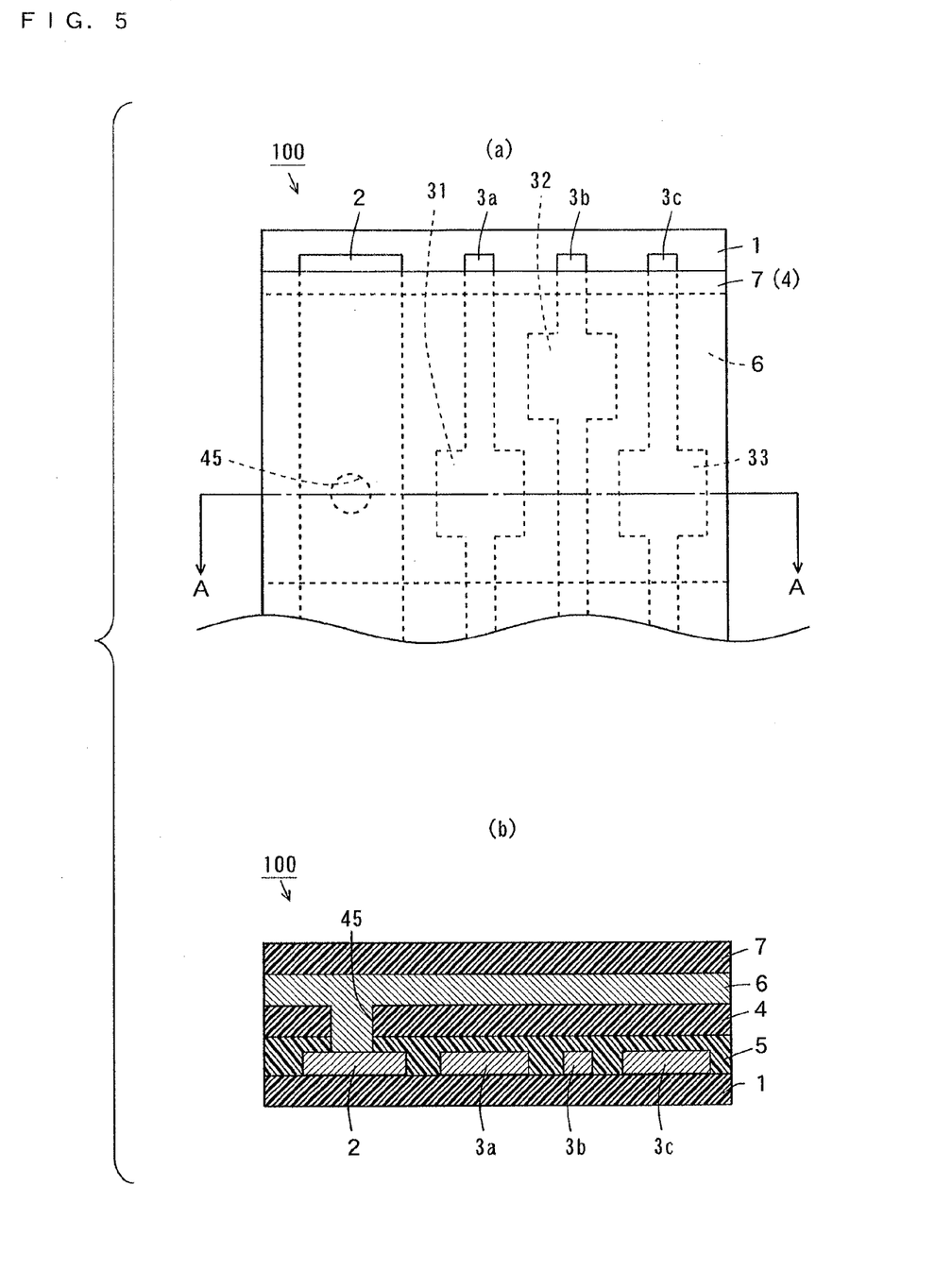
Figure 6:
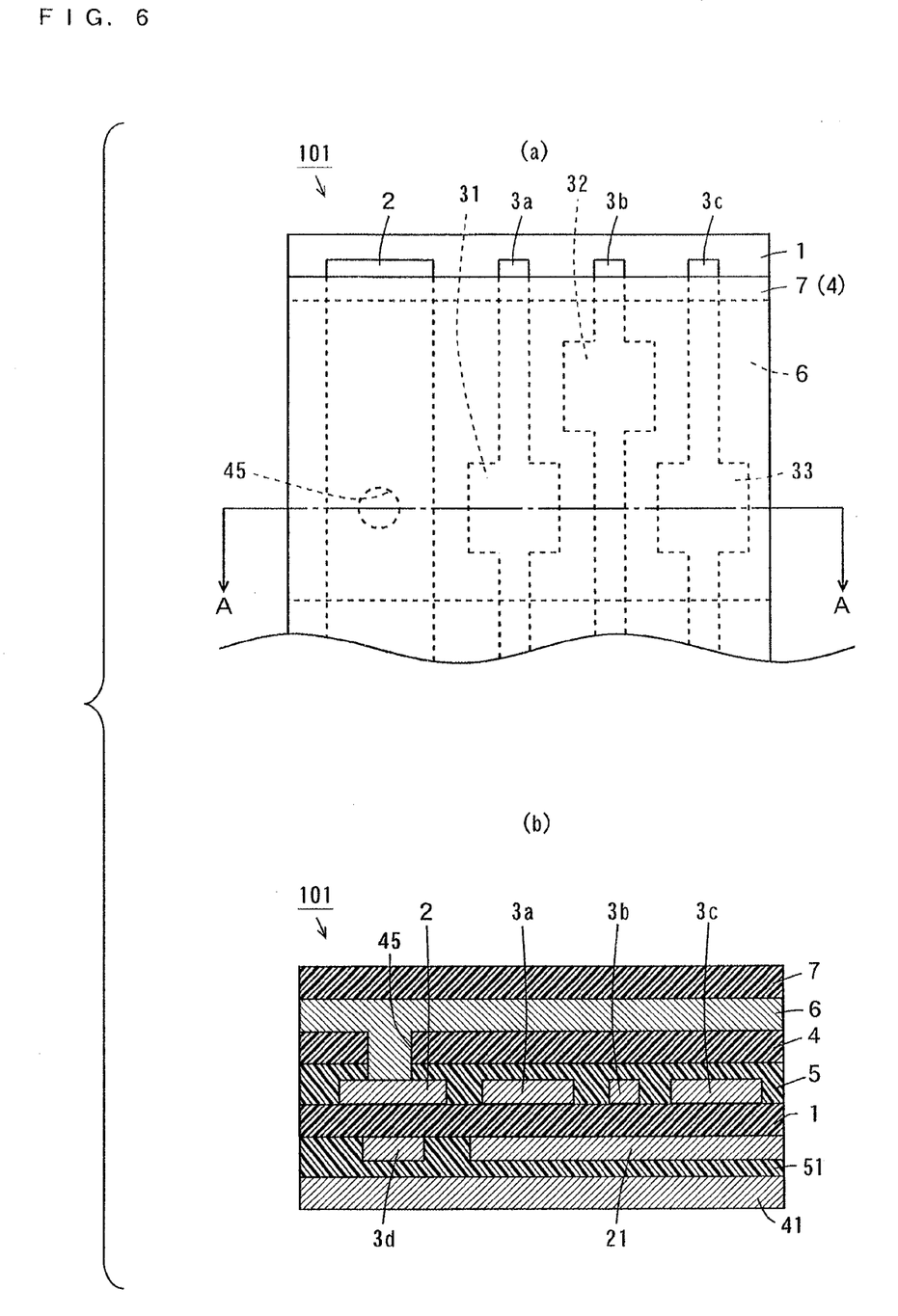
FIGS. 6(a) and 6(b) are schematic plan views and schematic sectional views showing a printed circuit board according to another embodiment of the present invention.

FIGS. 6(*a*) and 6(*b*) are schematic views showing an example of a printed circuit board with the ground lines and the signal lines formed on both sides of the base insulating layer 1. The printed circuit board 101 shown in FIGS. 6(*a*) and 6(*b*) is different from the printed circuit board 100 of FIGS. 5(*a*) and 5(*b*) in the following points. Note that in FIGS. 6(*a*) and 6(*b*), FIG. 6(*a*) is a top view and FIG. 6(*b*) is a sectional view taken along the line A-A of FIG. 6(*a*).

As shown in FIGS. 6(*a*) and 6(*b*), a ground line 21 and a fourth signal line 3d are provided on the lower surface of the base insulating layer 1 in the printed circuit board 101. Moreover, an adhesive layer 51 and a third cover insulating layer 41 are provided on the lower surface of the base insulating layer 1 so as to cover the ground line 21 and the fourth signal line 3d.

In the printed circuit board 101, more signals can be transmitted since the signal lines are formed on the both sides of the base insulating layer 1. Note that the fourth signal line 3d may be used as the ground line or a power supply line.

The ground line 21, the fourth signal line 3d, the adhesive layer 51 and the third cover insulating layer 41 can be formed in the same manner as that of the ground line 2, the first to third signal lines 3a to 3c, the adhesive layer 5 and the first cover insulating layer 4 of the printed circuit board 100 of FIGS. 5(*a*) and 5(*b*), for example.

(4) Correspondences Between Elements in the Claims and Parts in Embodiments

In the following paragraph, non-limiting examples of correspondences between various elements recited in the claims below and those described above with respect to various embodiments of the present invention are explained.

In the above-described embodiment, the first cover insulating layer 4 is an example of a cover insulating layer and the through hole 45 is an example of a through hole.

As each of various elements recited in the claims, various other elements having configurations or functions described in the claims can be also used.

INVENTIVE EXAMPLES

An inventive example and a comparative example in the present invention will now be described.

(a) First Inventive Example

Figure 7:
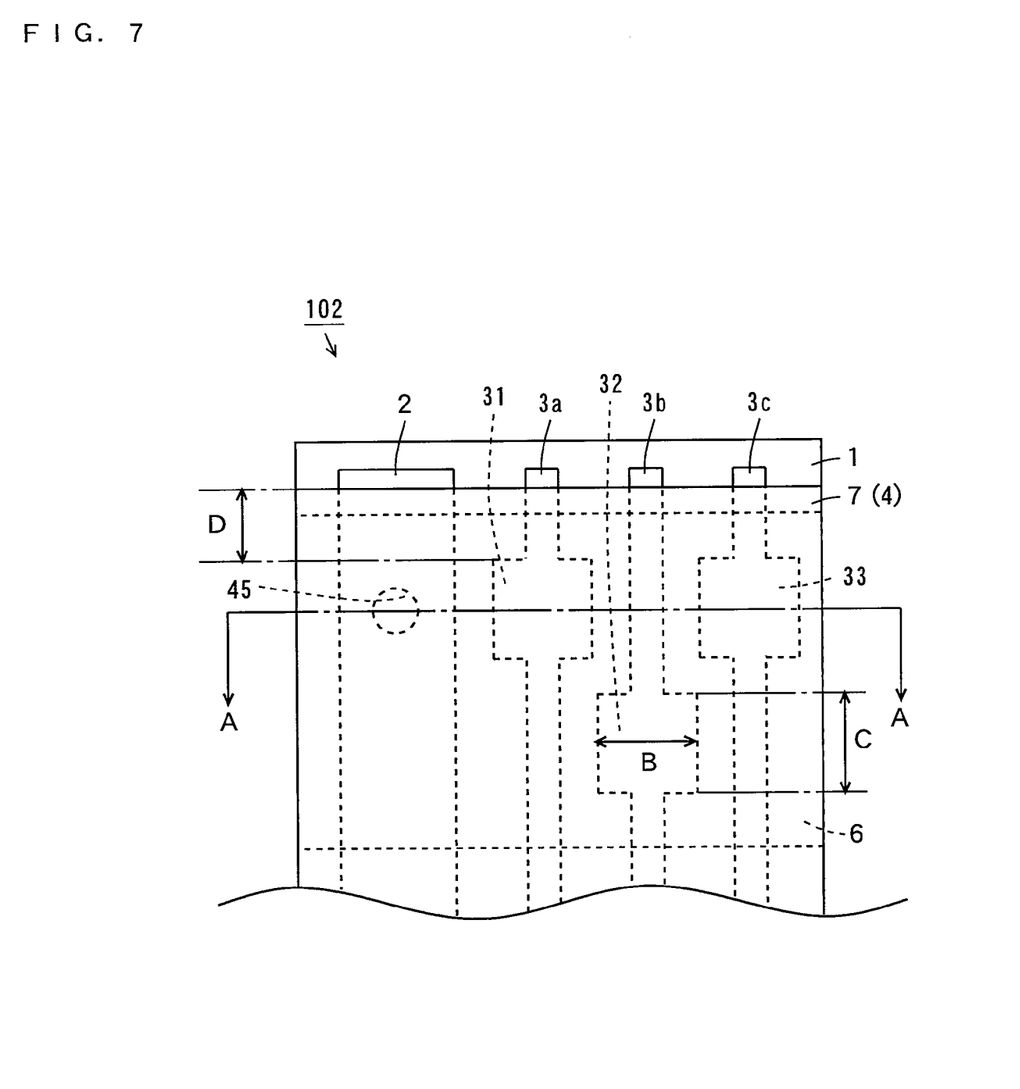
FIG. 7 is a top view showing a first inventive example of the present invention.

FIG. 7 is a top view showing a printed circuit board of a first inventive example of the present invention. The printed circuit board 102 of FIG. 7 is different from the printed circuit board 101 of FIGS. 6(*a*) and 6(*b*) in the following points. As shown in FIG. 7, the wide part 31 and the wide part 33 were arranged so that the one end of the first cover insulating layer 4 was positioned closer to the wide part 31 and the wide part 33 than the wide part 32 in the printed circuit board 102. Note that a sectional view taken along the line A-A of the printed circuit board 102 is the same as FIG. 6(*b*).

Polyimide resin having a thickness of 25 μm was used as the base insulating layer 1 of the printed circuit board 102. Each of the first to third signal lines 3a to 3c had a width of 0.2 mm and a thickness of 18 μm. The width B of each of the wide parts 31 to 33 was 3 mm and the length C was 2 mm. The distance D between the wide part 31, the wide part 33 and the one end of the first cover insulating layer 4 was 5 mm.

Moreover, the thickness of the first cover insulating layer 4 was 12.5 μm, the thickness of the second cover insulating layer 7 was 20 μm and the thickness of the third cover insulating layer 41 (see FIG. 6 (*b*)) was 12.5 μm. The diameter of the through hole 45 was 3 mm. Silver paste having a thickness of 25 μm was used as the conductive layer 6. In addition, the through hole 45 was filled with silver paste.

When the high frequency digital signal of 100 MHz was transmitted by using this printed circuit board 102, the harmonic of 440 MHz or higher was removed and the high frequency noise of 440 MHz or higher was not generated.

(b) Second Inventive Example

A printed circuit board of a second inventive example is different from the printed circuit board 102 of FIG. 7 in the following points. The width B of each of the wide parts 31 to 33 was 1 mm, and the length C was 2 mm in the printed circuit board of the second inventive example.

When the high frequency digital signal of 100 MHz was transmitted by using this printed circuit board, the harmonic of 1280 MHz or higher was removed and the high frequency noise of 1280 MHz or higher was not generated.

(c) Third Inventive Example

A printed circuit board of a third inventive example is different from the printed circuit board 102 of FIG. 7 in the following points. The width B of each of the wide parts 31 to 33 was 2 mm and the length C was 2 mm in the printed circuit board of the third inventive example.

When the high frequency digital signal of 100 MHz was transmitted by using this printed circuit board, the harmonic of 660 MHz or higher was removed and the high frequency noise of 660 MHz or higher was not generated.

(d) Fourth Inventive Example

Figure 8:
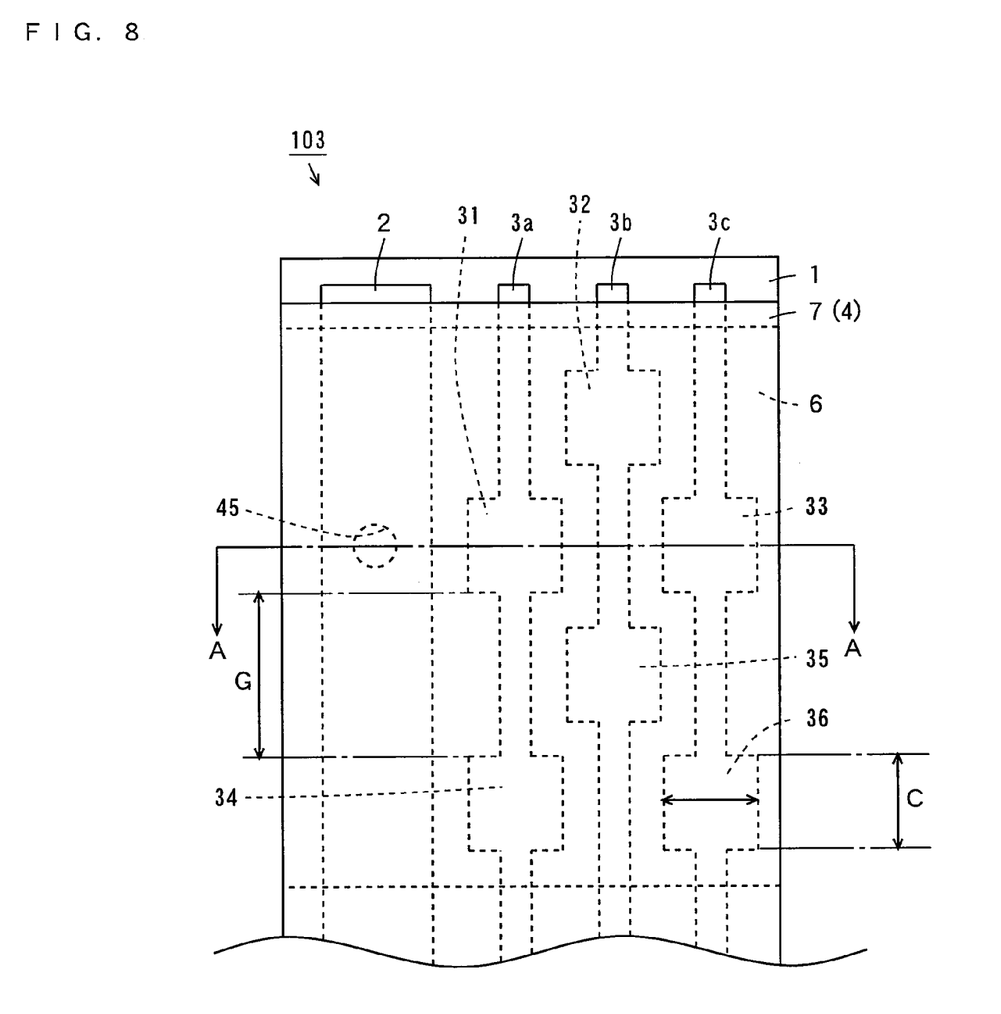
FIG. 8 is a top view showing a fourth inventive example of the present invention.

FIG. 8 is a top view showing a printed circuit board of a fourth inventive example of the present invention. The printed circuit board 103 of FIG. 8 is different from the printed circuit board 102 of FIG. 7 in the following points. As shown in FIG. 8, two wide parts 31, 34 were formed in the first signal line 3a, two wide parts 32, 35 were formed in the second signal line 3b, and two wide parts 33, 36 were formed in the third signal line 3c in the printed circuit board 103. Note that the width B of each of the wide parts 31 to 36 was 0.25 mm and the length C was 2 mm. Moreover, spacing G between the wide part 31 and the wide part 34 was 3 mm. Similarly, the wide parts 32, 35 were formed to have the spacing of 3 mm therebetween and the wide parts 33, 36 were formed to have the spacing of 3 mm therebetween.

When the high frequency digital signal of 100 MHz was transmitted by using this printed circuit board 103, the harmonic of 1620 MHz or higher was removed and the high frequency noise of 1620 MHz or higher was not generated.

(e) Fifth Inventive Example

A printed circuit board of a fifth inventive example is different from the printed circuit board 103 of FIG. 8 in the following points. The width B of each of the wide parts 31 to 36 was 0.5 mm and the length C was 2 mm in the printed circuit board of the fifth inventive example.

When the high frequency digital signal of 100 MHz was transmitted by using this printed circuit board, the harmonic of 1100 MHz or higher was removed and the high frequency noise of 1100 MHz or higher was not generated.

(f) Sixth Inventive Example

A printed circuit board of a sixth inventive example is different from the printed circuit board 103 of FIG. 8 in the following points. In the printed circuit board of the sixth inventive example, the width B of each of the wide parts 31 to 36 was 0.75 mm and the length C was 2 mm.

When the high frequency digital signal of 100 MHz was transmitted by using this printed circuit board, the harmonic of 750 MHz or higher was removed and the high frequency noise of 750 MHz or higher was not generated.

(g) Seventh Inventive Example

A printed circuit board of a seventh inventive example is different from the printed circuit board 103 of FIG. 8 in the following points. In the printed circuit board of the seventh inventive example, the width B of each of the wide parts 31 to 36 was 1 mm and the length C was 2 mm.

When the high frequency digital signal of 100 MHz was transmitted by using this printed circuit board, the harmonic of 570 MHz or higher was removed and the high frequency noise of 570 MHz or higher was not generated.

(h) Eighth Inventive Example

A printed circuit board of an eighth inventive example is different from the printed circuit board 103 of FIG. 8 in the following points. In the printed circuit board of the eighth inventive example, the width B of each of the wide parts 31 to 36 was 2 mm and the length C was 2 mm.

When the high frequency digital signal of 100 MHz was transmitted by using this printed circuit board, the harmonic of 300 MHz or higher was removed and the high frequency noise of 300 MHz or higher was not generated.

(i) Ninth Inventive Example

A printed circuit board of a ninth inventive example is different from the printed circuit board 103 of FIG. 8 in the following points. In the printed circuit board of the ninth inventive example, the width B of each of the wide parts 31 to 36 was 3 mm and the length C was 2 mm.

When the high frequency digital signal of 100 MHz was transmitted by using this printed circuit board, the harmonic of 200 MHz or higher was removed and the high frequency noise of 200 MHz or higher was not generated.

(j) Comparative Example

Figure 9:
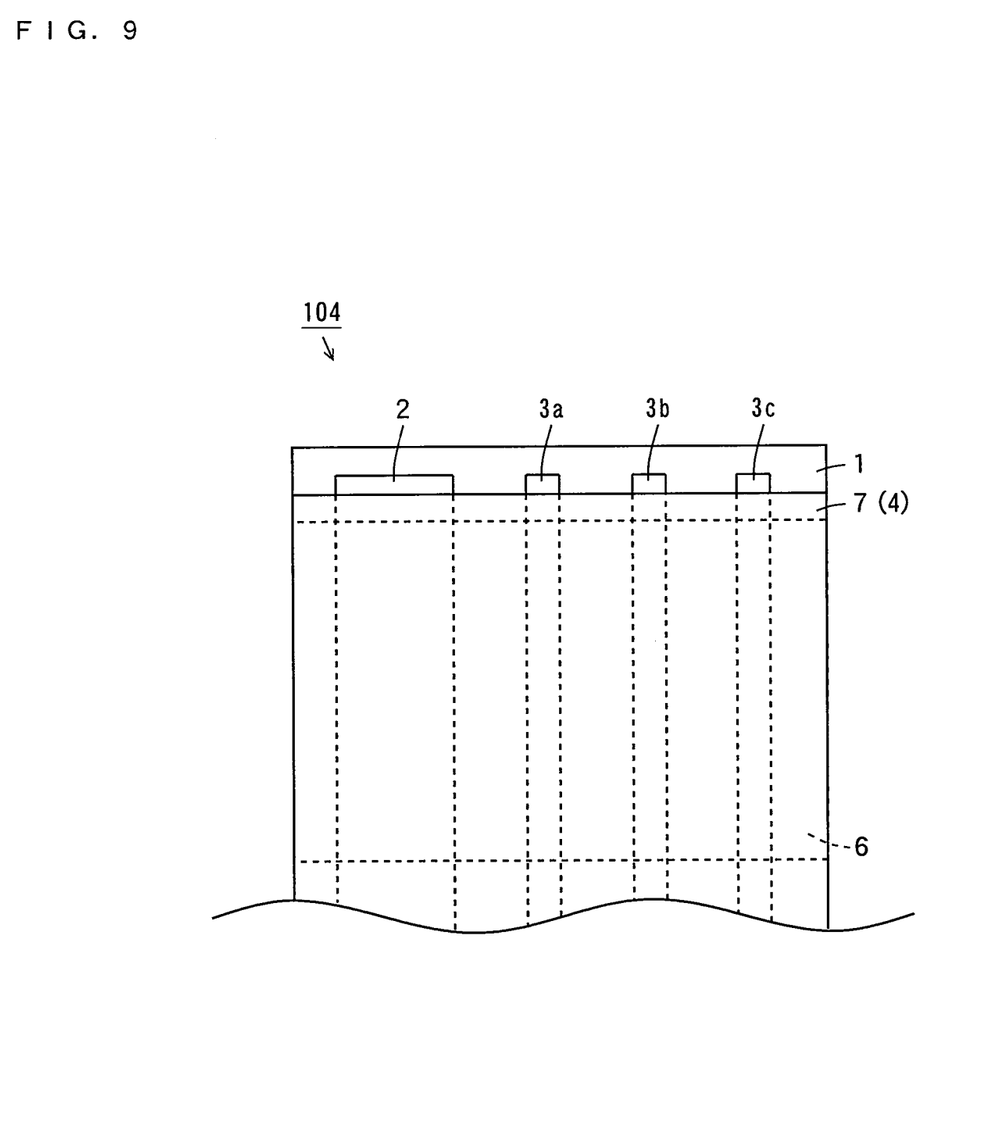
FIG. 9 is a top view showing a printed circuit board of a comparative example.

FIG. 9 is a top view showing a printed circuit board 104 of a comparative example. The printed circuit board 104 of the comparative example is different from the printed circuit board 102 of FIG. 7 in the following points. As shown in FIG. 9, the wide parts were not formed in the first to third signal lines 3a to 3c in the printed circuit board 104 of the comparative example.

When the high frequency digital signal of 100 MHz was transmitted by using this printed circuit board 104, the harmonic was not removed, and was transmitted as such. Accordingly, the high frequency noise of up to approximately 2 GHz was generated.

EVALUATIONS OF THE INVENTIVE EXAMPLES AND THE COMPARATIVE EXAMPLE

As described in the foregoing, it is found that the harmonic can be removed in the printed circuit board by forming the wide parts in the first to third signal lines 3a to 3c. In addition, it is found that the frequency of the harmonic that can be removed in the printed circuit board can be adjusted by adjusting the size and the number of the wide parts.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board comprising:
   a base insulating layer;
   a plurality of signal lines arranged on said base insulating layer, each signal line including a first end, a second end and a wide part between the first end and the second end, the wide parts of the plurality of signal lines arranged in a staggered manner on the base insulating layer;
   a cover insulating layer that is provided on said base insulating layer so as to cover at least said wide parts of said plurality of signal lines; and
   a conductive layer that is provided on said cover insulating layer,
   wherein each of the plurality of signal lines includes a capacitive element, the capacitive element comprising the respective wide part, the cover insulating layer and the conductive layer, such that when a signal is transmitted by a signal line, a harmonic of the signal is removed by the capacitive element of that signal line.

2. The printed circuit board according to claim 1, further comprising a ground line that is provided on said base insulating layer, wherein
   said conductive layer is electrically connected to said ground line.

3. The printed circuit board according to claim 2, wherein
   said cover insulating layer is formed so as to cover said ground line and said signal line, and
   said cover insulating layer includes a through hole for electrically connecting said ground line and said conductive layer.

4. The printed circuit board according to claim 1, wherein said signal line includes a plurality of said wide parts.

5. A printed circuit board comprising:
   a base insulating layer;
   a plurality of signal lines that are provided on said base insulating layer, the plurality of signal lines including wide parts;

a cover insulating layer that is provided on said base insulating layer so as to cover at least said wide parts of said plurality of signal lines; and a conductive layer that is provided on said cover insulating layer so as to cover a portion above said wide parts of said plurality of signal lines, wherein said wide parts of said plurality of signal lines are arranged in a staggered manner, wherein each of the plurality of signal lines includes a capacitive element, the capacitive element comprising the respective wide part, the cover insulating layer and the conductive layer, such that when a signal is transmitted by a signal line, a harmonic of the signal is removed by the capacitive element of that signal line.

6. A printed circuit board comprising:

a base insulating layer;

a plurality of signal lines that are provided on said base insulating layer, the plurality of signal lines including wide parts;

a cover insulating layer that is provided on said base insulating layer so as to cover at least said wide parts of said plurality of signal lines; and a conductive layer that is provided on said cover insulating layer so as to cover a portion above said wide parts of said plurality of signal lines, wherein said wide parts of said plurality of signal lines are arranged in a staggered manner, and one end of each of said plurality of signal lines is exposed from one end of said cover insulating layer.

* * * * *

UNITED STATES PATENT AND TRADEMARK OFFICE
CERTIFICATE OF CORRECTION

PATENT NO. : 8,227,699 B2  Page 1 of 1
APPLICATION NO. : 12/019661
DATED : July 24, 2012
INVENTOR(S) : Mitsuru Honjo It is certified that error appears in the above-identified patent and that said Letters Patent is hereby corrected as shown below:

Title page, Section (56) FOREIGN PATENT DOCUMENTS:

"JP 02003347699 A" should read – "JP 2003-347699A".

Signed and Sealed this
Thirtieth Day of October, 2012

David J. Kappos
*Director of the United States Patent and Trademark Office*